United States Patent
Okumura et al.

(10) Patent No.: US 6,900,071 B2
(45) Date of Patent: May 31, 2005

(54) SUBSTRATE AND METHOD FOR PRODUCING THE SAME, AND THIN FILM STRUCTURE

(75) Inventors: Mika Okumura, Tokyo (JP); Makio Horikawa, Tokyo (JP); Kiyoshi Ishibashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 73 days.

(21) Appl. No.: 10/381,046

(22) PCT Filed: Jul. 26, 2001

(86) PCT No.: PCT/JP01/06470
§ 371 (c)(1),
(2), (4) Date: Mar. 25, 2003

(87) PCT Pub. No.: WO03/012853
PCT Pub. Date: Feb. 13, 2003

(65) Prior Publication Data
US 2004/0021186 A1 Feb. 5, 2004

(51) Int. Cl.$^7$ ............................................... H01L 21/00
(52) U.S. Cl. ......................................... 438/52; 438/762
(58) Field of Search ........................... 438/52, 591, 762, 438/763

(56) References Cited
U.S. PATENT DOCUMENTS 5,663,077 A * 9/1997 Adachi et al. ............... 438/151
6,156,586 A   12/2000 Kolb ........................... 438/52
6,634,232 B1 * 10/2003 Rettig et al. ............. 73/514.15

FOREIGN PATENT DOCUMENTS

| CN | 2338750 Y | 9/1999 |
|---|---|---|
| JP | 55-9449 | 1/1980 |
| JP | 1-173635 | 7/1989 |
| JP | 08-45933 | 2/1996 |
| JP | 09-36387 | 2/1997 |
| JP | 10-214815 | 8/1998 |
| JP | 2001-36078 | 2/2001 |

OTHER PUBLICATIONS

Wolf, "Silicon Processing for the VLSI Era", 1986, pp. 182–188, 198–200.*

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A substrate is provided with a substrate main body made from silicon, and an oxide film for a base formed thereon. The oxide film includes a first oxide film made mainly of a thermal $SiO_2$ film formed by thermally oxidizing silicon in the substrate main body, and a second oxide film made of a high-temperature oxide film deposited and formed thereon. Alternatively the second oxide film may be formed by TEOS.

8 Claims, 4 Drawing Sheets

F I G. 6
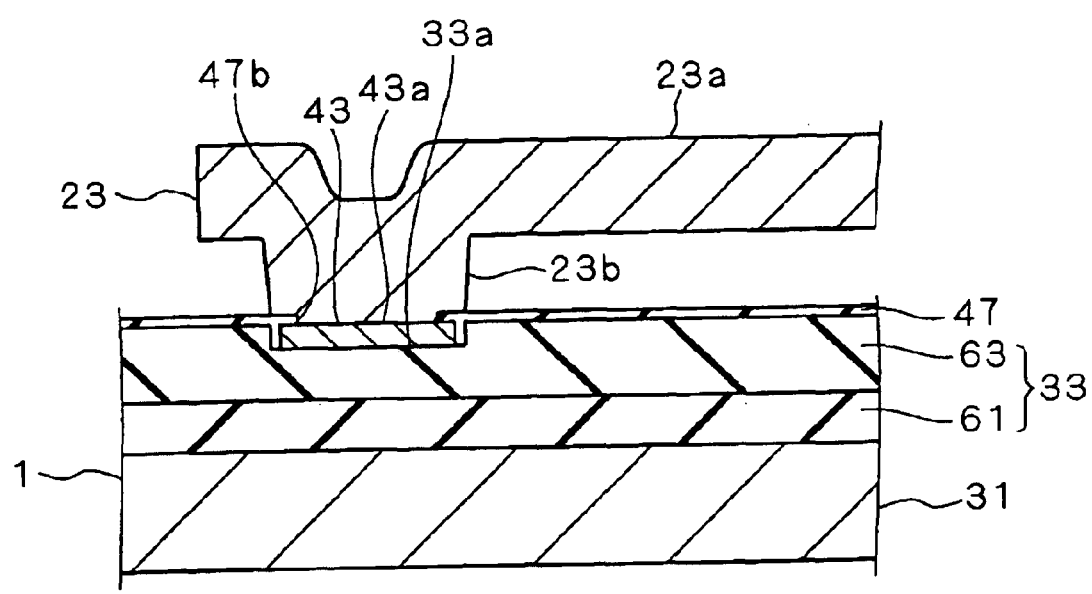

SUBSTRATE AND METHOD FOR PRODUCING THE SAME, AND THIN FILM STRUCTURE

TECHNICAL FIELD

The present invention relates to a substrate and a manufacturing method thereof as well as a thin-film structural body, and more particularly to a substrate used for an acceleration sensor, and a manufacturing method thereof as well as a thin-film structural body.

BACKGROUND ART

The present invention is applied to a substrate which is provided with a substrate main body mainly made of silicon and an oxide film for a base formed on the substrate main body. In such a substrate, due to a difference in thermal shrinkage characteristic between the oxide film and another film formed on the oxide film, a stress difference is generated between the oxide film and the other film, for example, after an annealing process, with the result that cracks might generate on the oxide film or the other film, or both of the oxide film and the other film due to the stress difference.

With respect to this problem, in a conventional substrate, the oxide film used for the base is formed by a thermal $SiO_2$ film which is made by thermally oxidizing silicon in the substrate main body. The resulting problem with such a conventional substrate is that a stress difference, generated between the oxidized $SiO_2$ film and another film formed thereon upon thermal shrinkage, tends to become greater. Moreover, in an attempt to make the film thickness of the oxide film used for the base thicker, there is degradation in the efficiency of the thermally oxidizing process due to the increased film thickness, and it takes a long time to form the oxide film.

DISCLOSURE OF THE INVENTION

The present invention has been devised to solve the above-mentioned problem, and an object thereof is to provide a substrate capable of reducing a stress difference generating between an oxide film on the substrate and another film formed on the oxide film upon thermal shrinkage and also shortening the time required for film formation at the time of forming a thick oxide film, and a manufacturing method thereof as well as a thin-film structural body.

In a first aspect of a substrate according to the present invention, the substrate includes: a substrate main body (31) mainly made of silicon; a first oxide film (48) formed on the substrate main body by thermally oxidizing the silicon contained in the substrate main body; and a second oxide film (49) formed on the first oxide film by depositing a TEOS oxide film.

In a second aspect of a substrate according to the present invention, the substrate includes: a substrate main body (31) mainly made of silicon; a first oxide film (61) formed on the substrate main body by thermally oxidizing the silicon contained in the substrate main body; and a second oxide film (63) formed on the first oxide film by depositing a high-temperature oxide film.

In a first aspect of a thin-film structural body according to the present invention, the thin-film structural body, which uses the substrate according to claim 1 or 2, includes: the substrate; and a thin-film body (21, 23, 25) formed on a sacrifice film (51) formed on the substrate, and placed with a predetermined gap from the substrate by removal of the sacrifice film.

In a second aspect of the thin-film structural body according to the present invention, the substrate constitutes a sensor substrate (1) installed in an acceleration sensor, and the thin-film body constitutes at least one portion of a sensor unit (3) which is installed in the acceleration sensor and has a function of detecting the acceleration.

In a first aspect of a manufacturing method of a substrate according to the present invention, the manufacturing method includes the steps of: forming a first oxide film (48) on a substrate main body (31) mainly made of silicon by thermally oxidizing the silicon in the substrate main body; and forming a second oxide film (49) by depositing a TEOS oxide film on the first oxide film.

In a second aspect of the manufacturing method of a substrate according to the present invention, the manufacturing method includes the steps of: forming a first oxide film (61) on a substrate main body (31) mainly made of silicon by thermally oxidizing the silicon in the substrate main body; and forming a second oxide film (63) by depositing a high-temperature oxide film on the first oxide film.

According to these aspects, upon thermal shrinkage, stresses, mutually exerted by both of the first and second oxide films, are allowed to have mutually opposite directions so that the both stresses are cancelled by each other, and reduced; thus, it becomes possible to reduce a stress difference generated between the first and second oxide films and another film formed on these oxide films, and consequently to prevent the generation of cracks.

Moreover, the first oxide film is formed by thermally oxidizing silicon in the substrate main body and the second oxide film is formed by depositing a TEOS oxide film or a high-temperature oxide film thereon; therefore, in a case of forming a thick oxide film used for a base, it becomes possible to shorten the time required for the film formation in comparison with a structure in which the oxide film for a base is formed by using only the first oxide film.

Furthermore, when the second oxide film is made of a high-temperature oxide film, it is possible to form an oxide film for a base with a higher insulating property, in comparison with a case where the second oxide film is formed by a TEOS oxide film.

These and other objects, features, aspects and advantages of the present invention will become more apparent in conjunction with the following detailed description and the accompanying drawings.

BRIEF DESCRIPTION OF THE DRAWINGS

FIG. 6 is a cross-sectional view taken along line A—A of FIG. 1, which shows a case where a substrate according to embodiment 2 of the present invention is applied to the semiconductor acceleration sensor shown in FIG. 1.

BEST MODE FOR CARRYING OUT THE INVENTION

1. Embodiment 1

Figure 1:
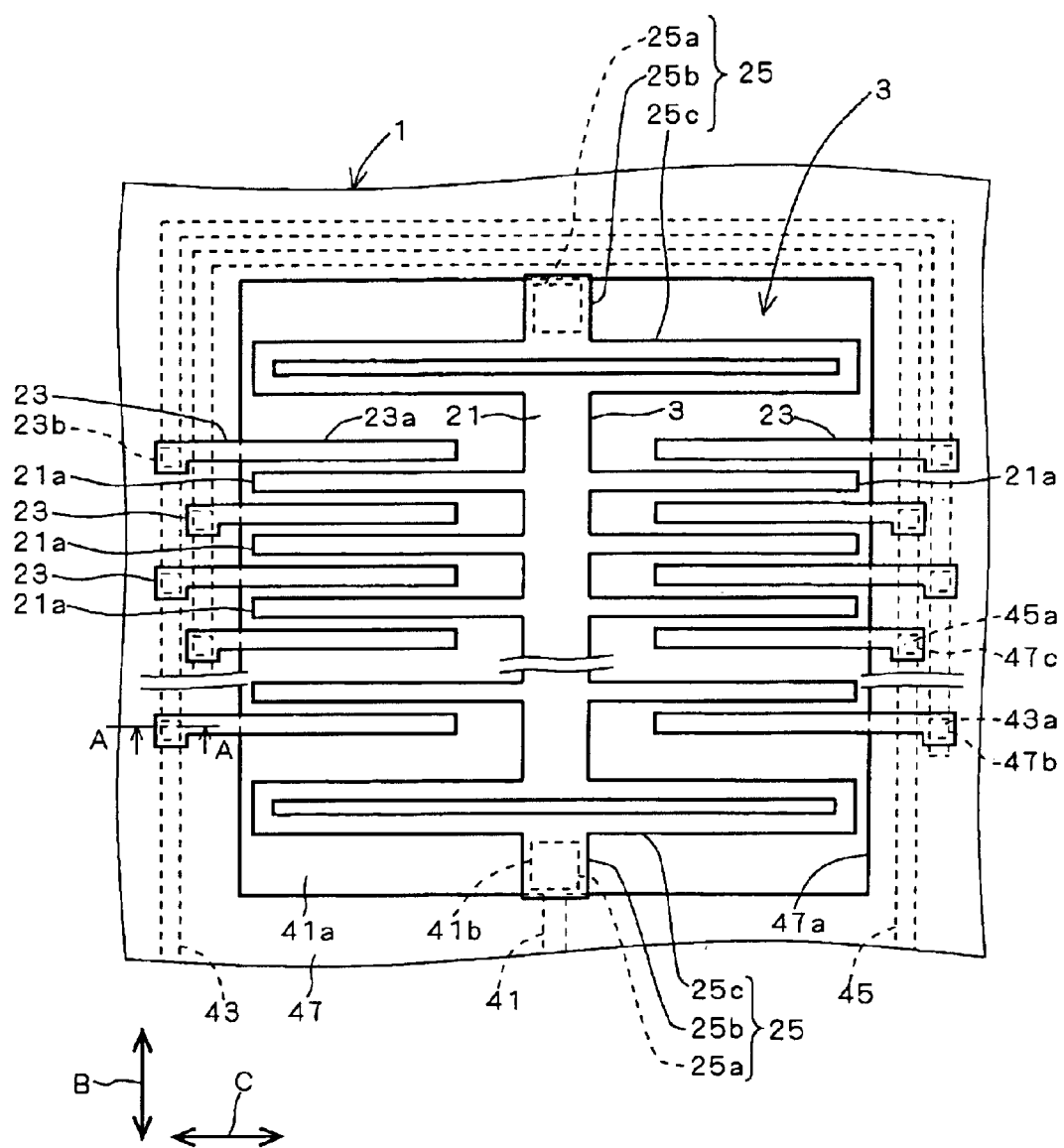
FIG. 1 is a plan view showing a configuration of a main part of a semiconductor acceleration sensor to which a substrate according to embodiment 1 of the present invention is applied.
Figure 2:
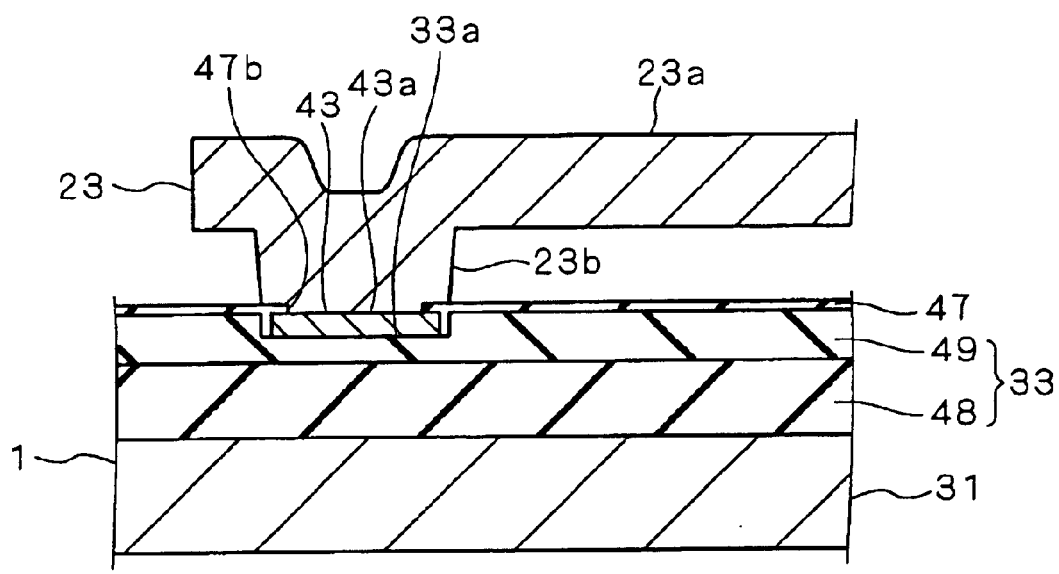
FIG. 2 is a cross-sectional view taken along line A—A of FIG. 1.

As shown in FIGS. 1 and 2, a semiconductor acceleration sensor, to which a substrate according to embodiment 1 of the present invention is applied, is provided with a substrate 1 serving as a sensor substrate, and a sensor unit 3 which is formed on the substrate 1 and has a function of detecting acceleration.

As shown in FIG. 1, the sensor unit 3 is provided with a mass body 21 functioning as a movable electrode, a plurality of fixed electrodes 23 and a plurality of beams 25. The mass body 21, the fixed electrodes 23 and the beams 25, which correspond to the thin-film body of the present invention, are formed by a conductive material, such as doped polysilicon made by doping polysilicon with impurities such as phosphorus.

The mass body 21 has a plurality of movable electrode portions 21a which are placed with a predetermined gap from the substrate 1, and extend in direction C perpendicular to direction B of acceleration to be detected. The beams 25, which are formed integrally with the mass body 21, have a function of suspending the mass body 21 over the substrate 1 in a manner so as to move in direction B with a restoring force. Each of the beams 25 is provided with a supporting portion 25a protruding from the substrate 1, a connecting portion 25b connected to the supporting portion 25a and a spring portion 25c placed between the connecting portion 25b and the edge of the mass body 21 with respect to direction B. The spring portion 25c is elastically bent and deformed so that the distance between the connecting portion 25b and the mass body 21 in direction B is increased and reduced.

The respective fixed electrodes 23 are formed in direction C with predetermined distances from each other in direction B. Moreover, the fixed electrode 23 is provided with a fixed electrode portion 23a serving as a floating portion to be placed with a predetermined distance from the substrate 1, and a supporting portion 23b for supporting the fixed electrode portion 23a.

The fixed electrode portions 23a of the respective fixed electrodes 23 and the movable electrode portions 21a of the mass body 21 are alternately placed with distances from each other in direction B to form a capacitor. Thus, based upon a change in the capacity of the capacitor caused by a shift of the movable electrode portion 21a, the acceleration is detected.

As shown in FIGS. 1 and 2, the substrate 1 is constituted by a substrate main body 31 made of a semiconductor such as silicon, an oxide film 33 for a base serving as a first insulating film formed on the substrate main body 31, a plurality of wires 41, 43, 45, selectively formed on the oxide film 33, and a nitride film 47 serving as a second insulating film which selectively covers the surface of the wires 41, 43, 45 and the surface of the silicon oxide film.

The oxide film 33 is provided with a first oxide film 48 made of a thermal $SiO_2$ film formed on the substrate main body 31, and a second oxide film 49 made of a TEOS (tetraethylorthosilicate) oxide film formed on the surface of the first oxide film 48.

Here, the oxide film 33 is formed by stacking the thermal $SiO_2$ film and the TEOS oxide film so that, in comparison with a case in which the oxide film 33 is formed by using only the thermal $SiO_2$ film, it becomes possible to reduce a stress difference exerted between the oxide film 33 and the nitride film 47 formed thereon or a sacrifice film 51, which will be described later, formed on the nitride film 47. This effect is obtained because upon thermal shrinkage, stresses, mutually generated by the thermal $SiO_2$ film and the TEOS oxide film, are allowed to have mutually opposite directions so that the two stresses are cancelled by each other, and reduced.

Moreover, the thermal $SiO_2$ film is formed through a reaction between the silicon in the substrate main body 31 and oxygen externally supplied; therefore, the resulting property is that, although the film-forming process is carried out at high speeds in the case of a thin film thickness, the reaction efficiency is lowered as the film thickness increases to reduce the film thickness to be formed per unit time. Moreover, the thermal $SiO_2$ film has an insulating property higher than that of the TEOS oxide film.

The film thickness of the oxide film 33 is set to a high value, for example, 20000 to 25000 angstroms. The film-thickness ratio of the two oxide films 48, 49 may be optionally set. In an attempt to reduce the stress difference and improve the film-forming efficiency, for example, the film thickness of the first oxide film 48 is set to 10000 angstroms, and the film thickness of the second oxide film 49 is set to 10000 to 15000 angstroms. Moreover, in an attempt to improve the insulating property of the oxide film 33, for example, the film thickness of the first oxide film 48 is set to 17000 angstroms, and the film thickness of the second oxide film 49 is set to 8000 angstroms.

The wire 41 is provided with an exposed portion 41a placed in an exposed state on an opposing area of the substrate 1 facing the mass body 21 on the substrate 1, and a contact portion 41b placed under the supporting portion 25a, and electrically connected to the supporting portion 25a. The wires 43, 45 are used for extracting signals from the fixed electrode 23, and connected to the respective fixed electrodes 23 through their contact portions 43a, 45a. The wires 41, 43, 45 are embedded in grooves 33a formed on the surface of the second oxide film 49 of the oxide film 33.

In a corresponding manner, a window section 47a and hole sections 47b, 47c are formed in the nitride film 47. Through the window section 47a, the exposed portion 41a of the wire 41 is exposed on the substrate 1, and the contact portion 41b is electrically connected to the supporting portion 25a. The contact portions 43a, 45a of the wires 43, 45 are electrically connected to the fixed electrode 23 through the hold sections 47b, 47c.

In the present embodiment, in accordance with such a configuration of the semiconductor acceleration sensor, a semiconductor acceleration sensor is manufactured through the following manufacturing method.

Figure 3:
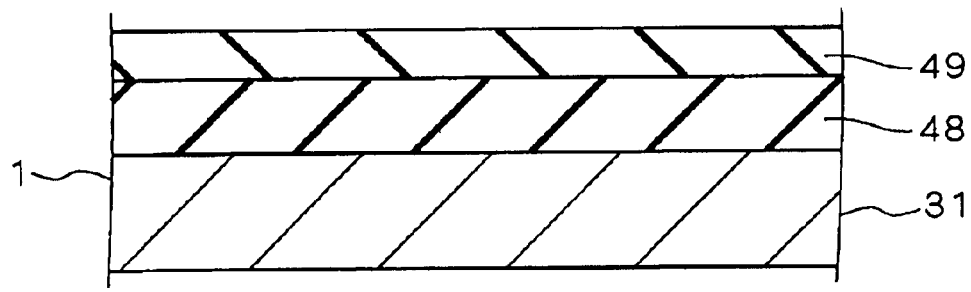
FIGS. 3 to 5 are cross-sectional views showing manufacturing processes of the structure shown in FIG. 2.

First, as shown in FIG. 3, a first oxide film 48 made of a thermal $SiO_2$ film is formed on a substrate main body 31 by thermally oxidizing silicon in the substrate main body 31. A TEOS oxide film is deposited on the first oxide film 48 to form a second oxide film 49. This TEOS oxide film is formed through a CVD process using TEOS gas.

Figure 4:
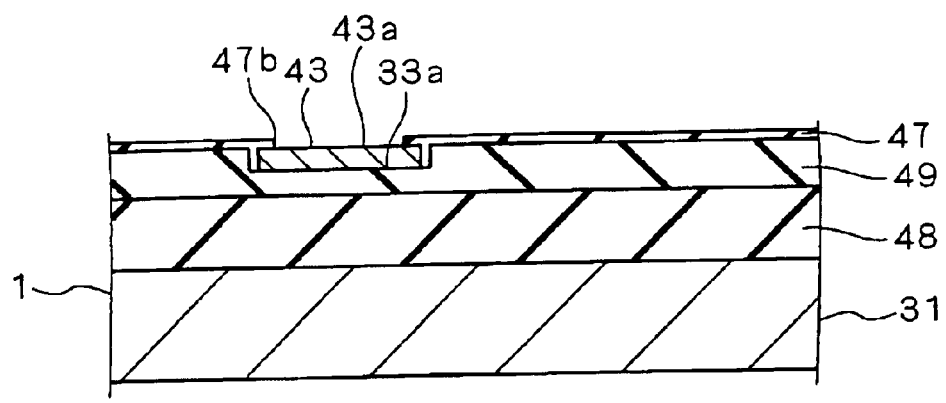

Next, grooves 33a are formed on the surface of the second oxide film 49, and the wires 41, 43, 45 are formed in the grooves 33a. Then, a nitride film 47 is formed on the surface of the wires 41, 43, 45 and the surface of the exposed second oxide film 49, and the nitride film 47 is partially removed so that the window section 47a and hole sections 47b, 47c are formed in the nitride film 47. As a result, a structure is formed along the position of line A—A as shown in FIG. 4.

Figure 5:
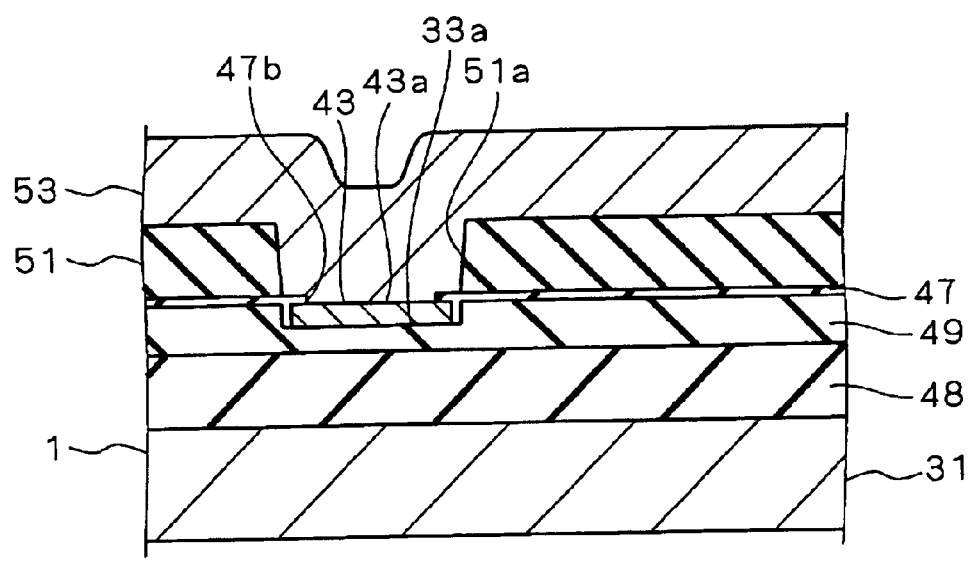

Successively, as shown in FIG. 5, a sacrifice film 51 is formed by, for example, a silicon oxide film on the substrate 1 thus formed. Then, portions of the sacrifice film 51 at which supporting portions 25a, 23b are to be formed are selectively removed to form the anchor hole section 51a, and a thin-film layer 53 is made from a conductive material, for example, a doped polysilicon, on the residual sacrifice film 51 and the substrate 1 which is exposed through the anchor hole section 51a.

Then, the thin-film layer 53 is selectively removed, and patterned so that the residual portions of the thin-film layer 53 are allowed to form the mass body 21, the beams 25 and the fixed electrode 23. At this time, portions of the residual portion, fitted into the anchor hole section 51a, form the supporting portions 25a, 23b, and the portions located on the sacrifice film 51 form the mass body 21, the spring portion 25c, the connecting portion 25b and the fixed electrode portion 23a. Then, the sacrifice film 51 is removed by an etching process so that a structure shown in FIGS. 1 and 2 is obtained.

As described above, according to the present embodiment, upon thermal shrinkage, stresses, mutually generated by the two first and second oxide films 48, 49, are allowed to have mutually opposite directions so that the two stresses are cancelled by each other, and reduced; thus, it becomes possible to reduce a stress difference generated between the base-film-use oxide film 33 and the nitride film 47 formed thereon or the sacrifice film 51 formed on the nitride film 47, and consequently to prevent the generation of cracks.

Moreover, the first oxide film 48 is formed by thermally oxidizing silicon in the substrate main body 31 and the second oxide film 49 is formed by depositing a TEOS oxide film thereon to form the second oxide film 49; thus, in a film-forming process of the thick oxide film 33, it becomes possible to shorten the time required for the film-forming process in comparison with a structure in which the oxide film 33 is formed by using only the first oxide film 48.

2. Embodiment 2

A substrate 1 according to the present embodiment is substantially different from the substrate 1 of the above-mentioned embodiment 1 only in that the configuration and manufacturing method of the oxide film 33 are different. Therefore, those portions in the substrate 1 of the present embodiment that correspond to those of the substrate 1 according to embodiment 1 are indicated by the same reference numerals, and the description thereof will not be repeated.

As shown in FIG. 6, in the substrate 1 according to the present embodiment, the oxide film 33 is constituted by a first oxide film 61 made of a thermal $SiO_2$ film that is formed on a substrate main body 31, and a second oxide film 63 made of a high-temperature oxide film deposited and formed on the first oxide film 61. The forming method of the first oxide film 61 is the same as the above-mentioned first oxide film 48. The second oxide film 63 is formed by depositing a high-temperature oxide film through a CVD process using silane gas under reduced pressure at 850° C.

In the present embodiment also, the film thickness of the oxide film 33 is set to a high value, for example, 25000 angstroms. The film-thickness ratio of the two oxide films 61, 63 may be optionally set. For example, the ratio of the film thickness of the first oxide film 61 and the film thickness of the second oxide film 63 is set to 7 to 3.

Here, the thermal $SiO_2$ film and the high-temperature oxide film that form the two oxide films 61, 63 are allowed to exert stresses the directions of which are opposite to each other upon shrinkage so that the stresses are cancelled by each other, and reduced.

With this arrangement, in the present embodiment also, it is possible to reduce the stress difference and also to shorten the processing time of the film-forming processes of the oxide film 33, in substantially the same manner as the above-mentioned embodiment 1.

Moreover, since the second oxide film 63 is formed by a high-temperature oxide film having an insulating property higher than the TEOS oxide film, it becomes possible to form an oxide film 33 having a higher insulating property.

While the present invention has been described in detail, the above description is illustrative in all aspects and the present invention is not restricted thereto. It will be understood that numerous variants which are not illustrated can be supposed without departing from the scope of the invention.

What is claimed is:

1. A substrate comprising:
   a substrate main body mainly made of silicon;
   a first oxide film formed on said substrate main body by thermally oxidizing said silicon contained in said substrate main body;
   a second oxide film formed on said first oxide film by depositing a TEOS oxide film;
   a thin-film body formed with a gap upward from said second oxide film the gap being formed directly above said second oxide film; and
   a supporting portion provided on said second oxide film to support said thin-film body.

2. A thin-film structural body, which uses the substrate according to claim 1:
   wherein a member of the thin-film body is formed on a sacrifice film formed on said second oxide film, and placed with said gap from said second oxide film by removal of said sacrifice film.

3. The thin-film structural body according to claim 2, wherein
   said substrate main body, said first oxide film, and said second oxide film constitute a part of a sensor substrate installed in an acceleration sensor, and
   said thin-film body constitutes at least one portion of a sensor unit which is installed in said acceleration sensor and has a function of detecting the acceleration.

4. A substrate comprising:
   a substrate main body mainly made of silicon;
   a first oxide film formed on said substrate main body by thermally oxidizing said silicon contained in said substrate main body; and
   a second oxide film formed on said first oxide film by depositing a high-temperature oxide films;
   a thin-film body formed with a gap upward from said second oxide film the gap being formed directly above said second oxide film; and
   a supporting portion provided on said second oxide film to support said thin-film body.

5. A thin-film structural body, which uses the substrate according to claim 4:
   wherein a member of the thin-film body is formed on a sacrifice film formed on said second oxide film, and placed with said gap from said second oxide film by removal of said sacrifice film.

6. The thin-film structural body according to claim 5, wherein
   said substrate main body, said first oxide film, and said second oxide film constitute a part of a sensor substrate installed in an acceleration sensor, and
   said thin-film body constitutes at least one portion of a sensor unit which is installed in said acceleration sensor and has a function of detecting the acceleration.

7. A manufacturing method of a substrate, comprising:
   forming a first oxide film on a substrate main body mainly made of silicon by thermally oxidizing said silicon in said substrate main body;

forming a second oxide film by depositing a TEOS oxide film on said first oxide film the gap being formed directly above said oxide film;

forming a thin-film body with a gap upward from said second oxide film; and providing a supporting portion on said second oxide film to support said thin-film body.

8. A manufacturing method of a substrate, comprising:

forming a first oxide film on a substrate main body mainly made of silicon by thermally oxidizing said silicon in said substrate main body;

forming a second oxide film by depositing a high-temperature oxide film on said first oxide film;

forming a thin-film body with a gay upward from said second oxide film the gap being formed directly above second oxide film; and providing a supporting portion on said second oxide film to support said thin-film body.

* * * * *